US009088284B2

(12) United States Patent
Bender et al.

(10) Patent No.: US 9,088,284 B2
(45) Date of Patent: *Jul. 21, 2015

(54) RAM BASED IMPLEMENTATION FOR SCALABLE, RELIABLE HIGH SPEED EVENT COUNTERS

(71) Applicant: International Business Machines Corporation, Armonk, NY (US)

(72) Inventors: Carl Alfred Bender, Highland, NY (US); Peter Heiner Hochschild, New York, NY (US); Ashutosh Misra, Uttar Pradesh (IN); Richard Swetz, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

This patent is subject to a terminal disclaimer.

(21) Appl. No.: 13/776,687

(22) Filed: Feb. 25, 2013

(65) Prior Publication Data

US 2013/0170605 A1 Jul. 4, 2013

Related U.S. Application Data

(63) Continuation of application No. 12/183,748, filed on Jul. 31, 2008.

(51) Int. Cl.
*H03K 21/00* (2006.01)
*G06F 11/34* (2006.01)
*H03K 23/42* (2006.01)

(52) U.S. Cl.
CPC ............. *H03K 21/00* (2013.01); *G06F 11/348* (2013.01); *H03K 23/42* (2013.01); *G06F 2201/86* (2013.01); *G06F 2201/88* (2013.01)

(58) Field of Classification Search
USPC ................................. 377/15, 49, 54
See application file for complete search history.

(56) References Cited

U.S. PATENT DOCUMENTS

| 4,206,346 A | 6/1980 | Hirosawa et al. |
| 5,089,957 A | 2/1992 | Stultz et al. |
| 5,388,133 A | 2/1995 | Vijeh et al. |

(Continued)

FOREIGN PATENT DOCUMENTS

| TW | 541459 B | 7/2003 |
| TW | 200539179 A | 12/2005 |

(Continued)

OTHER PUBLICATIONS

"Internal Performance Measurement Counters", IBM Tech. Disc. Bulletin, vol. 34, No. 4A, Sep. 1991, pp. 51-52.

*Primary Examiner* — Daniel Hess
(74) *Attorney, Agent, or Firm* — Roy W. Truelson

(57) ABSTRACT

There is broadly contemplated herein an arrangement whereby each event source feeds a small dedicated "pre-counter" while an actual count is kept in a 64-bit wide RAM. Such an implementation preferably may involve a state machine that simply sweeps through the pre-counters, in a predetermined fixed order. Preferably, the state machine will access each pre-counter, add the value from the pre-counter to a corresponding RAM location, and then clear the pre-counter. Accordingly, the pre-counters merely have to be wide enough such that even at a maximal event rate, the pre-counter will not be able to wrap (i.e., reach capacity or overflow) before the "sweeper" state machine accesses the pre-counter.

11 Claims, 3 Drawing Sheets

(56) References Cited

U.S. PATENT DOCUMENTS 5,790,625 A 8/1998 Arimilli
8,660,234 B2 * 2/2014 Bender et al. .................. 377/49

FOREIGN PATENT DOCUMENTS

| TW | 200809861 A | 2/2008 |
| TW | 200817897 A | 4/2008 |

* cited by examiner

RAM BASED IMPLEMENTATION FOR SCALABLE, RELIABLE HIGH SPEED EVENT COUNTERS

CROSS REFERENCE TO RELATED APPLICATION

This is a continuation of pending U.S. patent application Ser. No. 12/183,748, filed Jul. 31, 2008, entitled "RAM Based Implementation for Scalable, Reliable High Speed Event Counters", which is herein incorporated by reference. This application claims priority under 35 U.S.C. §120 of U.S. patent application Ser. No. 12/183,748.

FIELD OF THE INVENTION

The present invention relates generally to computer systems and to event counters that are employed in connection therewith

BACKGROUND OF THE INVENTION

As known in the computing arts, an event counter is a unit that can count occurrences of a certain condition. Hardware event counters are used for statistical counts, debugging during hardware bring-up and for performance characterization. The insight attained from performance monitors is used to resolve performance bottlenecks and in fine tuning configurable parameters in the system. Event counters are also used to trigger actions. For example, when an event counter reaches certain threshold, it could be used to generate an interrupt. In applications for event counters such as these and more, there is a strong need for precise counts.

A conventional implementation of a 64 bit counter involves the use of 64 registers as storage elements and of an adder to increment the count. Hundreds of 64 bit counters can normally occupy a significant amount of silicon space on ASICs (application-specific integrated circuits). In the case of an FPGA (field programmable gate array) based implementation, where there are limited number of logic building blocks (e.g., Look-Up Tables, or LUTs), the conventional manner of implementing hundreds of counters will consume a very significant number of LUTs.

Since ASICs and FPGAs provide a dense Random Access Memory (RAM) core, this has motivated a desire to substitute RAM for registers. Some attempts have been made to address this problem by implementing a plurality of counters into RAM (e.g., "RAM based events counter apparatus and method" (U.S. Pat. No. 5,089,957) and "System for gathering data representing the number of event occurrences" (U.S. Pat. No. 4,206,346). However, these prior attempts have presented potentially lossy schemes that do not take into account the frequency of the counted events. Accordingly, a compelling need has been recognized in connection with improving upon such shortcomings and disadvantages.

SUMMARY OF THE INVENTION

In accordance with at least one presently preferred embodiment of the present invention, there is broadly contemplated herein an arrangement whereby each event source feeds a small dedicated "pre-counter" while an actual count is kept in a 64-bit wide RAM.

Preferably, such an implementation may involve a state machine that simply sweeps through the pre-counters, in a predetermined fixed order. Preferably, the state machine will access each pre-counter, add the value from the pre-counter to a corresponding RAM location, and then clear the pre-counter. Accordingly, the pre-counters merely have to be wide enough such that even at a maximal event rate, the pre-counter will not be able to wrap (i.e., reach capacity or overflow) before the "sweeper" state machine accesses the pre-counter.

In summary, one aspect of the invention provides a system comprising: a main memory; the main memory comprising RAM; a plurality of preliminary counters each fed by a corresponding event source; and a sweeper which accesses preliminary counters and feeds values from preliminary counters to the RAM; the RAM acting to accumulate counting data relating to the event sources.

Another aspect of the invention provides a method comprising: providing a plurality of preliminary counters each fed by a corresponding event source; accessing the preliminary counters; feeding values from the preliminary counters to a RAM; and accumulating at the RAM counting data relating to the event sources.

Furthermore, an additional aspect of the invention provides a program storage device readable by machine, tangibly embodying a program of instructions executable by the machine to perform a method comprising: providing a plurality of preliminary counters each fed by a corresponding event source; accessing the preliminary counters; feeding values from the preliminary counters to a RAM; and accumulating at the RAM counting data relating to the event sources.

DETAILED DESCRIPTION OF THE PREFERRED EMBODIMENTS

For a better understanding of the present invention, together with other and further features and advantages thereof, reference is made to the following description, taken in conjunction with the accompanying drawings, and the scope of the invention will be pointed out in the appended claims.

Figure 1:
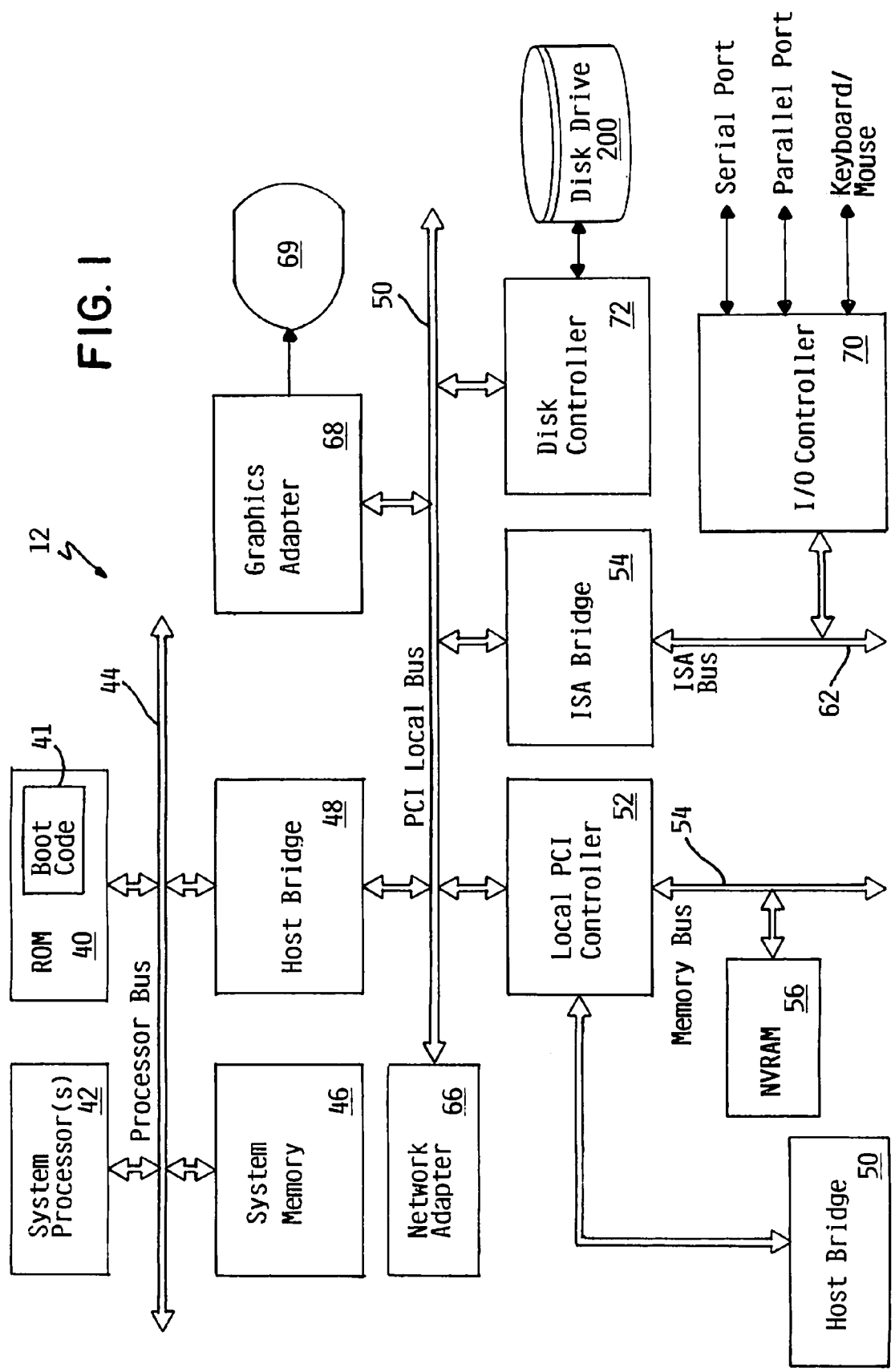
FIG. 1 schematically illustrates a computer system.
Figure 2:
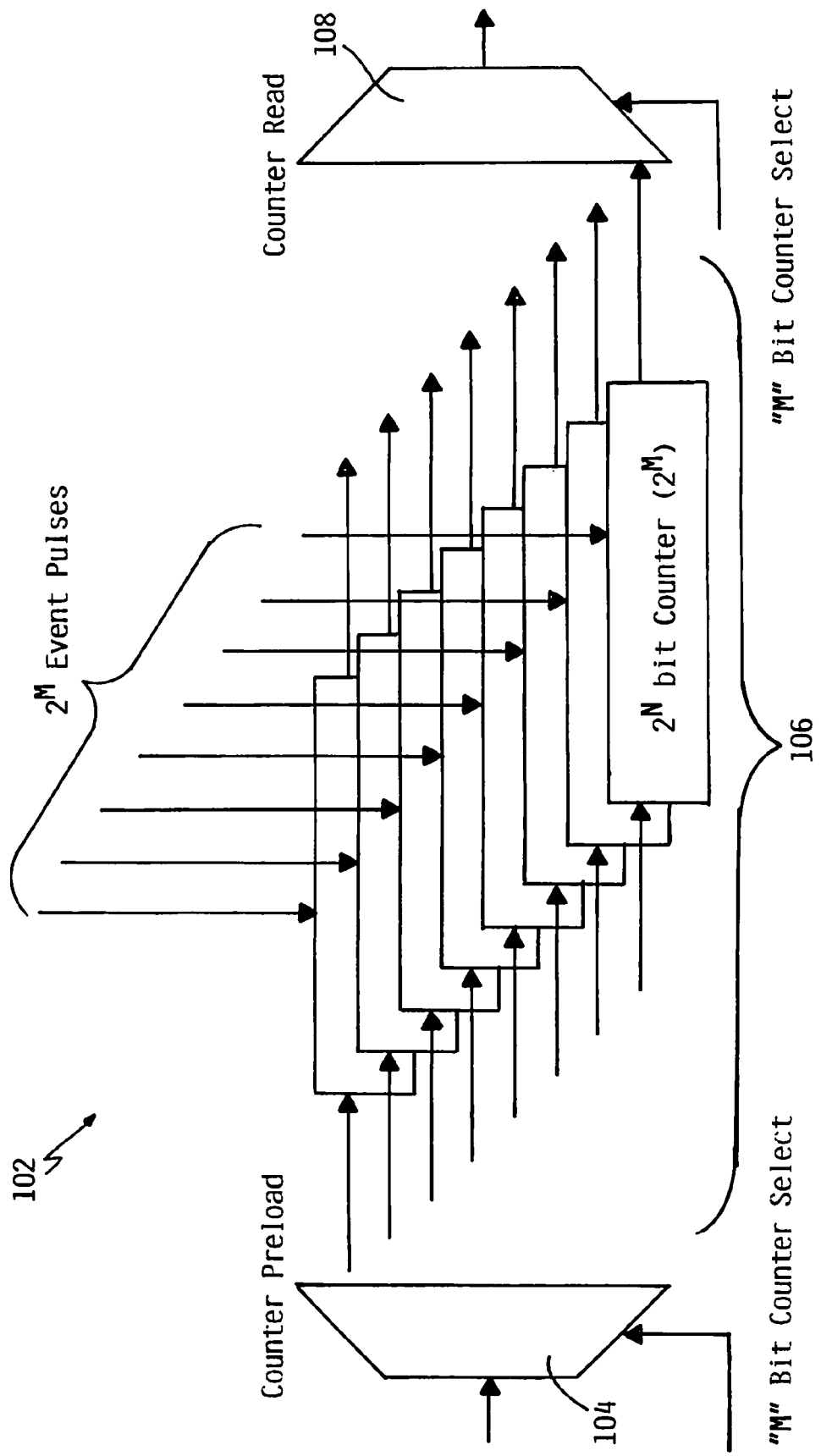
FIG. 2 schematically illustrates a conventional counter arrangement.
Figure 3:
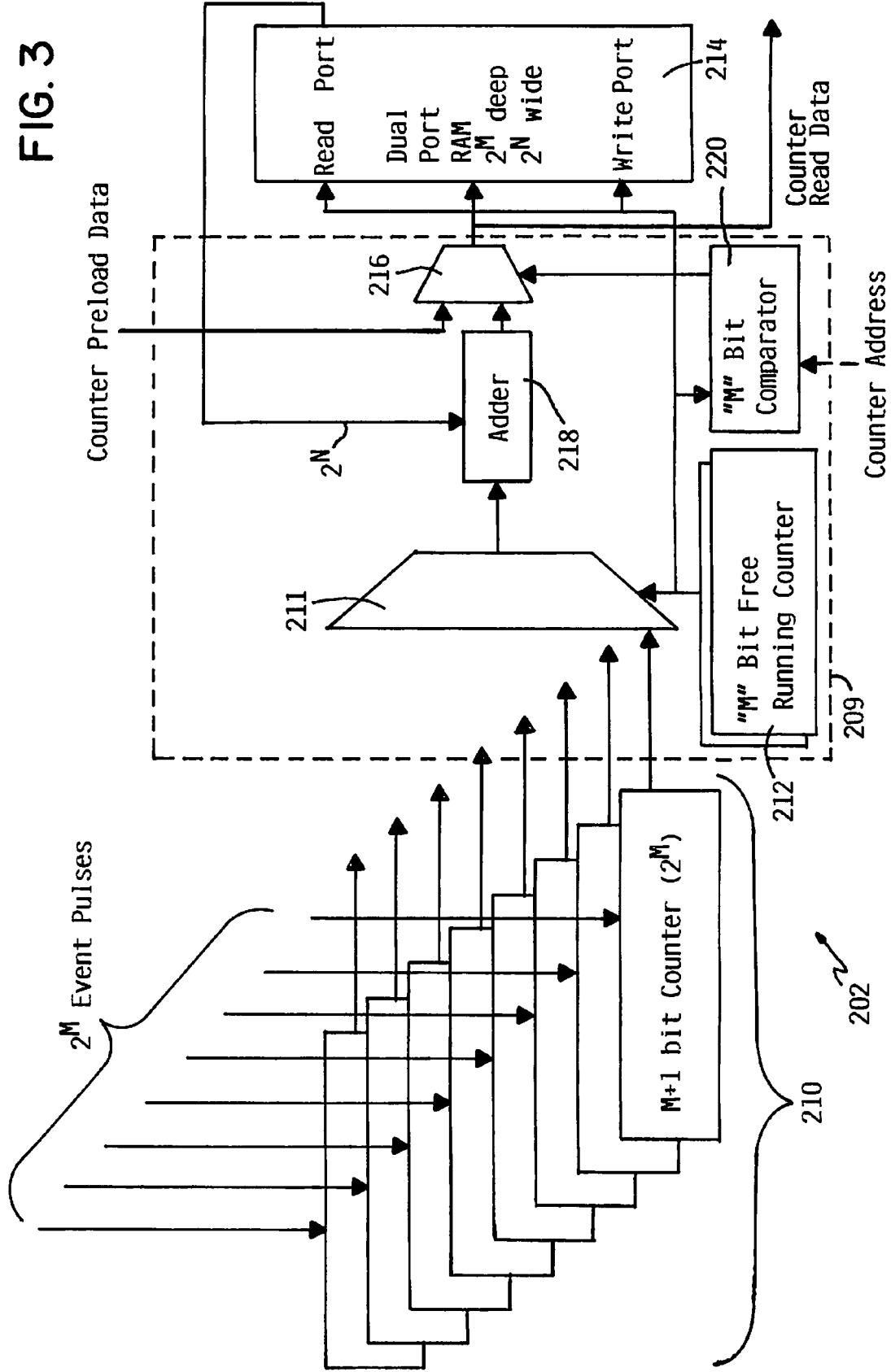
FIG. 3 schematically illustrates a counter arrangement in accordance with at least one preferred embodiment of the present invention.

It will be readily understood that the components of the present invention, as generally described and illustrated in the Figures herein, may be arranged and designed in a wide variety of different configurations. Thus, the following more detailed description of the embodiments of the apparatus, system, and method of the present invention, as represented in FIGS. 1 through 3, is not intended to limit the scope of the invention, as claimed, but is merely representative of selected embodiments of the invention.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals or other labels throughout. The following description is intended only by way of example, and simply illustrates certain selected embodiments of devices, systems, and processes that are consistent with the invention as claimed herein.

Referring now to FIG. 1, there is depicted a block diagram of an illustrative embodiment of a computer system 12. The illustrative embodiment depicted in FIG. 1 may be a notebook computer system, such as one of the ThinkPad® series of personal computers sold by Lenovo (US) Inc. of Morrisville, N.C., however, as will become apparent from the following description, the present invention is applicable to any data processing system. Notebook computers may alternatively be referred to as "notebooks", "laptops", "laptop computers" or "mobile computers" herein, and these terms should be understood as being essentially interchangeable with one another.

As shown in FIG. 1, computer system 12 includes at least one system processor 42, which is coupled to a Read-Only Memory (ROM) 40 and a system memory 46 by a processor bus 44. System processor 42, which may comprise one of the AMD™ line of processors produced by AMD Corporation or a processor produced by Intel Corporation, is a general-purpose processor that executes boot code 41 stored within ROM 40 at power-on and thereafter processes data under the control of operating system and application software stored in system memory 46. System processor 42 is coupled via processor bus 44 and host bridge 48 to Peripheral Component Interconnect (PCI) local bus 50.

PCI local bus 50 supports the attachment of a number of devices, including adapters and bridges. Among these devices is network adapter 66, which interfaces computer system 12 to a LAN, and graphics adapter 68, which interfaces computer system 12 to display 69. Communication on PCI local bus 50 is governed by local PCI controller 52, which is in turn coupled to non-volatile random access memory (NVRAM) 56 via memory bus 54. Local PCI controller 52 can be coupled to additional buses and devices via a second host bridge 60.

Computer system 12 further includes Industry Standard Architecture (ISA) bus 62, which is coupled to PCI local bus 50 by ISA bridge 64. Coupled to ISA bus 62 is an input/output (I/O) controller 70, which controls communication between computer system 12 and attached peripheral devices such as a keyboard and mouse. In addition, I/O controller 70 supports external communication by computer system 12 via serial and parallel ports. A disk controller 72 is in communication with a disk drive 200. Of course, it should be appreciated that the system 12 may be built with different chip sets and a different bus structure, as well as with any other suitable substitute components, while providing comparable or analogous functions to those discussed above.

For purposes of comparative illustration, FIG. 2 illustrates a conventional arrangement 102 for implementing 2M 2N-bit wide counters. An M bit address decoder 104 is used to initialize counter values. Each instance of the counter 106 includes 2N registers and an adder to increment the count based on an event pulse. A 2M:1 multiplexer 208 is then needed to read out each bit of each 2N bit counter.

In contrast, in an implementation 202 in accordance with a preferred embodiment of the present invention, as shown in FIG. 3, instead of having 2M instances of a 2N bit counter, there are instead provided 2M instances of smaller pre-counters (210). The actual 2M counts are preferably kept in a 2N bit wide RAM 214 (itself which may be contained in system memory 46 shown in FIG. 1), in a manner now to be described.

As alluded to above, implementation 202 involves the use of a state machine 209 that sweeps through all 2M pre-counters, in sequential order, using a free running M-bit counter (212). The machine 209 preferably assimilates the output of each pre-counter at a reader 211, adds the value to the corresponding RAM location and clears that pre-counter. Particularly, the adding preferably takes place at adder 218, which adds the pre-counter value to an old counter value that has been fed back from RAM 214. Gate 216 accepts the output of adder 218, and output of an "M" bit comparator 220 (itself having as input counter addresses and output from the "M" bit free running counter 212), whereupon output from here proceeds into RAM 214. For RAM 214 in its role as the "main" or "primary" counter, a pre-load or initialization can take place through gate 216, whose output also can forward counter read data as shown.

Since the state machine 209 accesses each pre-counter once during every 2M clock cycle, the pre-counters merely have to be wide enough to hold a maximum value of 2M at a maximum event rate. By choosing pre-counters to be "M+1" bit(s) wide, the implementation guarantees that those small pre-counters will never overflow before the sweeper state machine 211 accesses them.

To put it another way, it should be appreciated that instead of being burdened with the "bulk" normally provided by 2M dedicated event counters of width 2N, the RAM 214 will actually take on the main counting task while much smaller event counters (herein the "pre-counters", or "preliminary counters") are actually set with the task of essentially monitoring incremental event counting changes and forwarding the same on to the RAM 214. Thus, large event counters are not actually needed to monitor and track incremental event counting changes; these are actually assimilated at the RAM 214 to provide an economy of resources that is simply not possible with 2M dedicated event counters of width 2N. Since the state machine 209 also includes components such as the free running "M" bit counter 212 and the "M" bit comparator 220, the incremental changes in the event counters are easily "indexed" (i.e., augmented with address/location information) that facilitates their easy incorporation into the "main counts" being accumulated in the RAM 214. Effectively, the RAM 214 takes on the analogous role of a large number of event counters without requiring the inefficient use of resources associated with a large number of dedicated event counters.

Preferably provided is a dual port RAM 214 as shown, whereby the old value of a counter can be read through a "read" port while the other counter can be updated through a "write" port in the same clock cycle. However, a single port RAM is also conceivable, in that RAM reading and writing would be interleaved. There, each pre-counter would get serviced after every 2M+1 clock cycles, thus requiring the pre-counter to be "M+2" bits wide.

To help illustrate the efficiencies discussed and alluded to above, the following table (Table 1) compares resource utilization in implementing 128 64-bit wide counters using conventional method (left) and a presently proposed method (right) on an Altera StratixII FPGA. In FPGA technology, Look-Up Tables (LUTs) are basic logic building blocks. Each LUT includes a 6-input table and a register. In a presently preferred embodiment of the present invention ("proposed method" in Table 1), the state machine serves each pre-counter at every 128 clock cycle, so 8 bit wide pre-counters are required.

TABLE 1

Resource Utilization on FPGA (128 "64-bit counters", i.e. M = 7 and N = 6))

| Main Functional Blocks | Conventional Method | Proposed Method |
|---|---|---|
| 128 counters | 128*64 LUT | 128*8 LUT |
| 64 "128:1" Multiplexer for reading a 64 bit count vector out of 128 counters. | 64*85 LUT | |
| 8 "128:1" Multiplexer for selecting one pre-counter out of 128 pre-counters | | 8*85 LUT |
| 64 "2:1" Multiplexer for selecting either preload-count or updated count | | 64*1 LUT |
| 7 bit decoder for initializing register based 128 counters | 144 LUT | |
| 1 Adder (64 bit old count + 8 bit pre-count) | | 66 LUT |
| 7 bit Free Running Counter for Reading old counter value | | 7 LUT |
| 7 bit Free Running Counter for Writing new counter value (Skewed by 3 clocks) | | 7 LUT |
| 7 bit Comparator to compare address against free running counter for counter reading/initialization. | | 5 LUT |
| RAM | | 1 KB RAM |
| Total | 13776 LUTs | 1853 LUTs + 1 KB RAM |

It will be appreciated that pre-counters, as broadly contemplated herein, can be exploited in recursive fashion. For example, one can use "pre-pre-counters" whereby for each of a number of predetermined groups of pre-counters (each group containing, e.g., 16 pre-counters), there could be maintained a small RAM of M+1 bit counts. Each pre-pre-counter could be 5 bits in width, whereupon bottom-level state machines would each sweep through the 16 entry RAMs (adding the 5 bits of register to the M+1 bits of RAM, resulting in a new M+1 bit count). Then, a top-level state machine could "eavesdrop" on, or monitor, this traffic to update its own 2N-bit counts stored in the larger, wider RAM.

In view of the foregoing, it will be appreciated that an implementation as embodied in accordance with at least one presently preferred embodiment of the present invention will present the following advantages, at the very least, over conventional implementations:

precise counting in spite of a RAM based implementation;
reduced resource utilization on integrated circuit chips;
a frequency of counted events that needs not be less than the clock frequency used in the implementation; and
an accuracy in counting suitable for reliable interrupt generation.

Among other advantages are the following:
Inherent logic is provided to support reading and preloading of counter, so it does not consume much extra logic to initialize the counters or read the counter values.

The use of RAM hard-core reduces the number of placeable elements, resulting in improved placement.

Instead of having register-based implementation for pre-counters, each group of pre-counters can adopt the same proposed RAM based implementation (see the "pre-pre-counter" approach described above), resulting in even more resource savings.

Reducing the counts with respect to a master-slave LSSD (level-sensitive scan design) results in fewer scan elements and hence lesser fewer scan chains, thereby helping reduce chip testability time.

The use of RAM permits the use of MBIST (memory BIST, or memory built-in self-test), which would improve testability.

Scalability is supported while performance is preserved. Particularly, designers do not have to limit the number of counters, nor do they need to multiplex many events with respect to a limited number of available counters.

It is to be understood that the present invention, in accordance with at least one presently preferred embodiment, includes elements that may be implemented on at least one general-purpose computer running suitable software programs. These may also be implemented on at least one Integrated Circuit or part of at least one Integrated Circuit. Thus, it is to be understood that the invention may be implemented in hardware, software, or a combination of both.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A system comprising:
a main memory;
said main memory comprising RAM;
a plurality of preliminary counters each fed by a corresponding event source; and
a sweeper which repeatedly accesses said preliminary counters and feeds values from said preliminary counters to said RAM in a plurality of continuous successive sweeps using an M-bit free running counter, said plurality of sweeps being conducted at fixed, predetermined intervals of 2M (2 to the power of M) cycles of incrementing said M-bit free running counter, wherein said sweeper accesses, in each sweep, each counter of said plurality of preliminary counters in a predetermined order, feeds a value of the respective preliminary counter to said RAM, and resets the respective preliminary counter, a single respective counter of said plurality of preliminary counters being selected in each of a plurality of cycles of said 2M cycles according to a respective corresponding value of said M-bit free running counter, each successive sweep commencing upon completion of an immediately preceding sweep, said fixed, predetermined intervals being sufficiently short to prevent overflow of a count of any event maintained in said preliminary counters;
said RAM acting to accumulate counting data relating to the event sources.

2. The system according to claim 1, wherein the sweeper acts to access each of 2**M (2 to the power of M) preliminary counters in sequential order in each sweep.

3. The system according to claim 1, wherein each preliminary counter has a width of M+1 bits.

4. The system according to claim 1, wherein said sweeper comprises a state machine.

5. The system according to claim 1, wherein said sweeper acts to add an output value from a preliminary counter to a corresponding RAM location, whereby a previous count value is incremented at said corresponding RAM location.

6. The system according to claim 1, wherein said RAM comprises a read port and a write port.

7. A system comprising:
a main memory;
said main memory comprising RAM;
a plurality of preliminary counters each fed by a corresponding event source; and
a sweeper comprising a hardware state machine having N ordered states which repeatedly accesses said preliminary counters and feeds values from said preliminary counters to said RAM in a plurality of continuous successive sweeps, said plurality of sweeps being conducted at fixed, predetermined intervals of N cycles of changing state of said hardware state machine, said hardware state machine assuming a different respective state of said N states corresponding to each of the N cycles within a sweep in a fixed, predetermined order, wherein said sweeper accesses, in each sweep, each counter of said plurality of preliminary counters in a fixed, predetermined order corresponding to the order of said N states of said hardware state machine, feeds a value of the respective preliminary counter to said RAM, and resets the respective preliminary counter, a single respective counter of said plurality of preliminary counters being selected in each of a plurality of cycles of said sweep according to a current state of said hardware state machine, each successive sweep commencing upon completion of an immediately preceding sweep, said fixed, predetermined intervals being sufficiently short to prevent overflow of a count of any event maintained in said preliminary counters;
said RAM acting to accumulate counting data relating to the event sources.

8. The system according to claim 7, wherein said hardware state machine comprises an M-bit free running counter, said plurality of sweeps being conducted at fixed, predetermined intervals of 2**M (2 to the power of M) cycles of incrementing said M-bit free running counter, the single respective counter of said plurality of preliminary counters which is selected in each of the plurality of cycles of said sweep being selecting according to a respective corresponding value of said M-bit free running counter.

9. The system according to claim 7, wherein said hardware state machine comprises no more than 2**M (2 to the power of M) cycles in each sweep and each preliminary counter has a width of M+1 bits.

10. The system according to claim 7, wherein said sweeper acts to add an output value from a preliminary counter to a corresponding RAM location, whereby a previous count value is incremented at said corresponding RAM location.

11. The system according to claim 7, wherein said RAM comprises a read port and a write port.

* * * * *